(12) United States Patent
Yun et al.

(10) Patent No.: US 9,030,869 B2
(45) Date of Patent: May 12, 2015

(54) THREE DIMENSIONAL SEMICONDUCTOR MEMORY DEVICE

(75) Inventors: Jung-Yun Yun, Seoul (KR); Jong-Yeol Park, Goyang-Si (KR); Chi-Weon Yoon, Seoul (KR); Sung-Won Yun, Suwon-Si (KR); Su-Yong Kim, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 222 days.

(21) Appl. No.: 13/584,847

(22) Filed: Aug. 14, 2012

(65) Prior Publication Data
US 2013/0051146 A1 Feb. 28, 2013

(30) Foreign Application Priority Data

Aug. 22, 2011 (KR) .................. 10-2011-0083576

(51) Int. Cl.
*G11C 11/34* (2006.01)
*G11C 7/22* (2006.01)
*H01L 27/115* (2006.01)
*G11C 16/04* (2006.01)

(52) U.S. Cl.
CPC ...... *H01L 27/11582* (2013.01); *G11C 16/0483* (2013.01)

(58) Field of Classification Search
CPC .................. G11C 16/0483; G11C 8/08; G11C 2211/5641
USPC ............. 365/185.05, 185.17, 185.27, 185.18, 365/185.01, 185.11, 189.15
See application file for complete search history.

(56) References Cited

U.S. PATENT DOCUMENTS

| 7,212,434 | B2 * | 5/2007 | Umezawa ................ 365/185.01 |
| 2002/0163834 | A1 * | 11/2002 | Scheuerlein et al. .... 365/185.17 |
| 2008/0310229 | A1 * | 12/2008 | Hamada .................... 365/185.11 |
| 2009/0185422 | A1 * | 7/2009 | Kang et al. ............... 365/185.11 |
| 2009/0251962 | A1 * | 10/2009 | Yun et al. ................. 365/185.02 |
| 2010/0008165 | A1 * | 1/2010 | Macerola et al. ........ 365/189.15 |
| 2010/0124117 | A1 * | 5/2010 | Kutsukake et al. ...... 365/185.11 |
| 2011/0194366 | A1 * | 8/2011 | Kwon ........................... 365/195 |

FOREIGN PATENT DOCUMENTS

| JP | 2008-072051 | 3/2008 |
| JP | 2009-146942 | 7/2009 |
| KR | 10-0557220 | 2/2006 |
| KR | 20090106869 | 10/2009 |

* cited by examiner

*Primary Examiner* — J. H. Hur
*Assistant Examiner* — Ajay Ojha
(74) *Attorney, Agent, or Firm* — Volentine & Whitt, PLLC

(57) ABSTRACT

A three-dimensional (3D) semiconductor memory device comprises memory cell strings each comprising at least one selection transistor and at least one memory cell, a first pass transistor group sharing a first well region and comprising a first selection line pass transistor connected to the selection transistor and a first world line pass transistor connected to the memory cell, a second pass transistor group sharing a second well region and comprising a second selection line pass transistor connected to the selection transistor, and a controller that controls the first pass transistor group and the second pass transistor group. The controller applies selected voltages to the first and second well regions during read operation.

19 Claims, 11 Drawing Sheets

THREE DIMENSIONAL SEMICONDUCTOR MEMORY DEVICE

CROSS-REFERENCE TO RELATED APPLICATIONS

This application claims priority under 35 U.S.C. §119 to Korean Patent Application No. 10-2011-0083576 filed on Aug. 22, 2011, the disclosure of which is hereby incorporated by reference in its entirety.

BACKGROUND OF THE INVENTION

The inventive concept relates generally to electronic memory technologies. More particularly, the inventive concept relates to three-dimensional (3D) semiconductor memory devices having vertically stacked cell transistors.

There is a continuing demand for high capacity and high performance semiconductor memory devices. This continuing demand has provided motivation for ongoing research focused on increasing the integration density of semiconductor memory devices.

One recent trend in memory research has focused on developing 3D memory semiconductor devices. For example, researchers have developed 3D flash memory devices. These devices are intended to increase integration density by vertically stacking cell transistors on a single chip.

In general, the transition to 3D semiconductor memory devices has presented a host of new technical challenges, such as the challenge of reliably manufacturing the 3D cells, the challenge of achieving reliable and efficient operating characteristics, and so on. Accordingly, researchers are engaged in ongoing efforts to address these and other technical challenges related to 3D semiconductor memory devices.

SUMMARY OF THE INVENTION

According to one embodiment of the inventive concept, a 3D semiconductor memory device comprises at least one memory cell string comprising at least one selection transistor and at least one memory cell, a first pass transistor group sharing a first well region and comprising a first selection line pass transistor connected to the selection transistor and a first world line pass transistor connected to the memory cell, a second pass transistor group sharing a second well region and comprising a second selection line pass transistor connected to the selection transistor, and a controller that controls the first pass transistor group and the second pass transistor group. The controller applies a first negative voltage to the first well region and applies a second voltage higher than the first voltage to the second well region during a read operation.

According to another embodiment of the inventive concept, a 3D semiconductor memory device comprises at least one block comprising a plurality of memory cell strings each comprising at least one selection transistor and at least one memory cell, a first pass transistor group sharing a first well region and comprising a first selection line pass transistor connected to the at least one selection transistor and a first world line pass transistor connected to the at least one memory cell, a second pass transistor group sharing a second well region and comprising a second selection line pass transistor connected to the at least one selection transistor, and a controller that controls the first pass transistor group and the second pass transistor group. The controller applies a first negative voltage to the first well region and applies 0V to the second well region during a read operation.

According to still another embodiment of the inventive concept, a 3D semiconductor memory device comprises a 3D array of memory cell strings each comprising at least one selection transistor and at least one memory cell, and first and second pass transistor groups located on opposite sides of the 3D array of memory cell strings and configured to bi-directionally drive at least one of the selection transistors and to uni-directionally drive at least one of the memory cells during a read operation.

These and other embodiments of the inventive concept can potentially improve the speed and other performance metrics associated with read operations in 3D semiconductor memory devices.

BRIEF DESCRIPTION OF THE DRAWINGS

The drawings illustrate selected embodiments of the inventive concept. In the drawings, like reference numbers indicate like features. In addition, features in the drawings are not necessarily drawn to scale or in the precise form as they would be produced under real-life manufacturing conditions.

DETAILED DESCRIPTION

Embodiments of the inventive concept are described below with reference to the accompanying drawings. These embodiments are presented as teaching examples and should not be construed to limit the scope of the inventive concept.

The terms used in this description are intended to describe certain embodiments of the inventive concept and are not to limit the inventive concept. Terms in the singular form encompass the plural form as well unless otherwise indicated by context or express description. Terms such as "comprise", "comprising", "include", and/or "including" indicate the presence of stated features, but they do not preclude the presence of additional features. The term "and/or" indicates any and all combinations of one or more associated listed items.

Terms such as first, second, etc., are used to describe various features, but the described features are not to be limited by these terms. Rather, these terms are used merely to distinguish between different features. Accordingly, a first feature could alternatively be termed a second feature without changing the meaning of the relevant description. Similarly, spatially relative terms such as "left" and "right" are used as examples of different directions in describing different embodiments. These terms, however, are merely used for convenience and are not to be construed as limiting.

Figure 1:
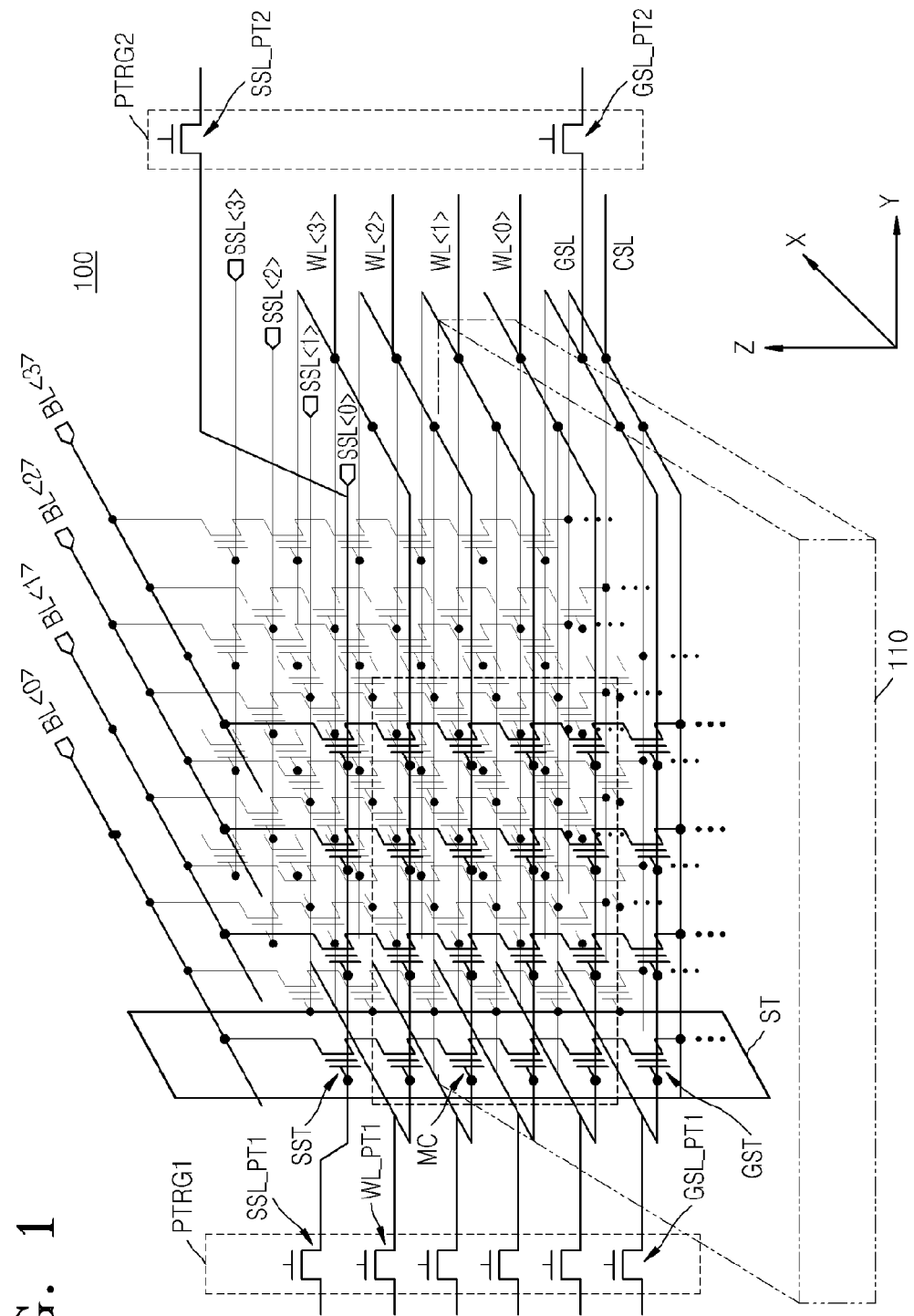
FIG. 1 is a circuit diagram illustrating a 3D semiconductor memory device according to an embodiment of the inventive concept.

FIG. 1 is a circuit diagram illustrating a 3D semiconductor memory device 100 according to an embodiment of the inventive concept.

Referring to FIG. 1, 3D semiconductor memory device 100 comprises a substrate 110, a plurality of memory cell strings ST, word lines WL<0> to WL<3>, bit lines BL<0> to BL<3>, and a controller (not shown).

Memory cell strings ST are aligned between bit lines BL<0> to BL<3> and a common source line CSL in a matrix of four rows in an x-direction and four columns in a y-direction on substrate 110. Memory cell strings ST extend from substrate 110 in a protruding direction, for example, a z-direction perpendicular to substrate 110. Each of memory cell strings ST comprises four memory cells MC along the z-direction, a source selection transistor SST, and a ground selection transistor GST. The source selection transistor SST of each memory cell string ST is connected to one of source selection lines SSL<0> to SSL<3> extending in the y-direction and is controlled to allow access to the memory cell string ST. The ground selection transistor GST of each memory cell string ST is connected to a ground selection line GSL extending in the x and y-directions and is controlled to ground the memory cell string ST during access operations. For explanation purposes, the term "block" will be used to refer to memory cells MC contained in memory cell strings ST arranged in a matrix of four rows in the x-direction and four columns in the y-direction.

Four word lines WL<0> to WL<3> are aligned in the z-direction perpendicular to substrate 110. Word lines WL<0> to WL<3> are disposed in four different layers in the z-direction where memory cells MC of memory cell strings ST are disposed. Each of word lines WL<0> to WL<3> is connected to a block of memory cells MC. In other words, they are connected in a matrix of four rows in the x-direction and four columns in the y-direction. Bit lines BL<0> to BL<3> are connected to memory cell strings ST aligned in the x-direction.

The controller performs programming and/or verifying operations on memory cells MC by applying controlled voltages to word lines WL<0> to WL<3> and bit lines BL<0> to BL<3>. In particular, the controller selects one of memory cell strings ST by applying controlled voltages to bit lines BL<0> to BL<3> and source selection lines SSL<0> to SSL<3> connected to source selection transistor SST, and selects one of memory cells MC in the selected memory cell string ST by applying controlled voltages to word lines WL<0> to WL<3>. Thus, a programming operation and/or verifying operation may be performed on a selected memory cell MC.

Memory cells MC, source selection transistor SST, and ground selection transistor GST of each memory cell string ST share the same channel. The channel extends from substrate 110 in the z-direction perpendicular to substrate 110. For example, the channel may have a channel last structure, such as bit-cost scalable (BiCS) structure where it is formed after a gate and an insulating layer are formed, or a channel first structure, such as terabit cell array transistor (TCAT) structure where it is formed and then a gate and an insulating layer are formed.

3D semiconductor memory device 100 further comprises a first pass transistor group PTRG1 that controls source selection lines SSL<0> to SSL<3>, ground selection line GSL, and word lines WL<0> to WL<3> in a first direction (e.g., at a left side). Transistors in first pass transistor group PTRG1 share a first well region (not shown), and they comprise a first source selection line pass transistor SSL_PT1 connected to source selection lines SSL<0> to SSL<3>, a first ground selection line pass transistor GSL_PT1 connected to ground selection line GSL, and a first word line pass transistor WL_PT1 connected to word lines WL<0> to WL<3>. A controller (not shown) controls first pass transistor group PTRG1 to apply appropriate voltages to source selection lines SSL<0> to SSL<3>, ground selection line GSL, and word lines WL<0> to WL<3> at appropriate times.

3D semiconductor memory device 100 further comprises a second pass transistor group PTRG2 that controls source selection lines SSL<0> to SSL<3> and ground selection line GSL in a second direction (e.g., at a right side) opposite the first direction. Transistors in second pass transistor group PTRG2 share a second well region (not shown), and they comprise a second source selection line pass transistor SSL_PT2 connected to source selection lines SSL<0> to SSL<3> and a second ground selection line pass transistor GSL_PT2 connected to ground selection line GSL. The controller controls second pass transistor group PTRG2 to apply appropriate voltages to source selection lines SSL<0> to SSL<3> and ground selection line GSL at appropriate times. Memory cell strings ST are disposed between first pass transistor group PTRG1 and second pass transistor group PTRG2.

Source selection lines SSL<0> to SSL<3> and ground selection line GSL can be bi-directionally controlled by first pass transistor group PTRG1 and second pass transistor group PTRG2. For example, source selection transistor SST can be bi-directionally driven by first source selection line pass transistor SSL_PT1 provided at the left side and second source selection line pass transistor SSL_PT2 provided at the right side. Similarly, ground selection transistor GST can be bi-directionally driven by first ground selection line pass transistor GSL_PT1 provided at the left side and second ground selection line pass transistor GSL_PT2 provided at the right side.

In the bi-directional driving, source selection transistor SST is turned on and off by driving voltages supplied by first source selection line pass transistor SSL_PT1 at the left side and second source selection line pass transistor SSL_PT2 at the right side. The bi-directional driving allows ground selection transistor GST to be turned on and off by driving voltages supplied by first ground selection line pass transistor GSL_PT1 at the left side and second ground selection line pass transistor GSL_PT2 at the right side.

Meanwhile, word lines WL<0> to WL<3> are uni-directionally driven by first pass transistor group PTRG1. In the uni-directional driving, data stored in memory cells MC is read according to a read voltage supplied by a left (or right) single word line pass transistor (e.g., first word line pass transistor WL_PT1). That is, the data stored in memory cells MC is read by first pass transistor group PTRG1 and may not be read by second pass transistor group PTRG2.

Figure 2:
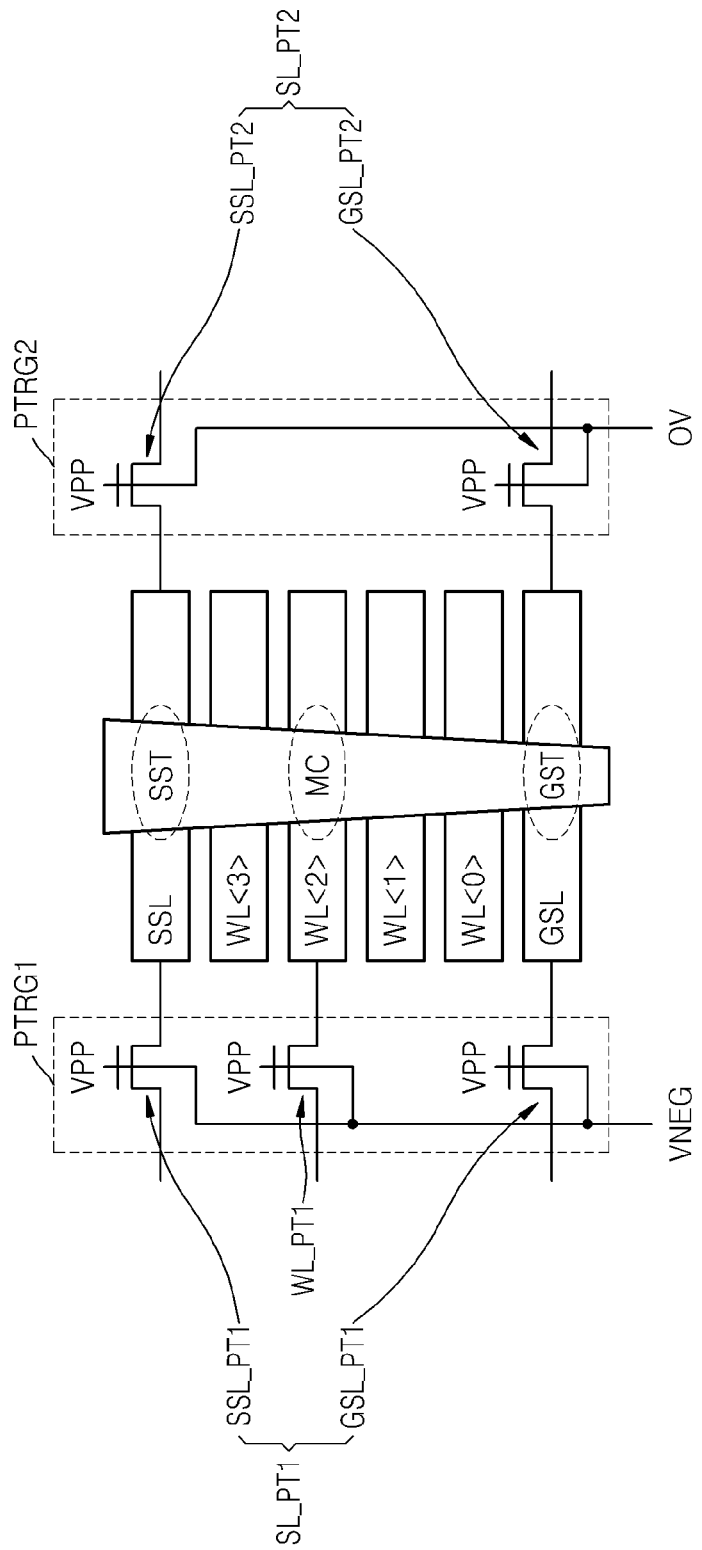
FIG. 2 is a cross-sectional view of a first portion of the 3D semiconductor memory device of FIG. 1 according to an embodiment of the inventive concept.

FIG. 2 is a cross-sectional view of a first portion of the 3D semiconductor memory device of FIG. 1 according to an embodiment of the inventive concept. This portion of FIG. 2 is provided to illustrate the uni-directional driving of word lines WL<0> to WL<3>.

Referring to FIG. 2, to read stored data from memory cells MC having a threshold voltage distribution with a negative value, a negative read voltage is applied to a word line (e.g., WL<2>), and a well bias is applied to first word line pass transistor WL_PT1 connected to word line WL<2> with a negative voltage.

First source selection line pass transistor SSL_PT1, first ground selection line pass transistor GSL_PT1 connected to ground selection line GSL, and first word line pass transistor WL_PT1 in first pass transistor group PTRG1 share a first well region (not shown). Accordingly, the well bias of the negative voltage is applied to first source selection line pass transistor SSL_PT1 and first ground selection line pass transistor GSL_PT1 to apply the well bias of the negative voltage to first word line pass transistor WL_PT1. The data stored in memory cells MC is read by first pass transistor group PTRG1 and is not read by second pass transistor group PTRG2.

A selection transistor (i.e. source selection transistor SST) and ground selection transistor GST have high driving capacities (i.e. bias current), so the selection transistor and ground selection transistor GST are bi-directionally driven. A negative voltage does not need to be applied to a gate of the selection transistor, so the negative voltages do not need be applied to wells of selection line pass transistors (i.e. the first and second source selection line pass transistors SSL_PT1 and SSL_PT2) and first and second ground selection line pass transistors GSL_PT1 and GSL_PT2.

Meanwhile, the word line (e.g., WL<2>) has a relatively low capacity, and thus the word line may be uni-directionally driven. However, as described above, where the data stored in memory cells MC connected to word line WL<2> has the threshold voltage of the negative value, a negative voltage is applied to a well of first word line pass transistor WL_PT connected to word line WL<2> during a read operation.

The controller applies a negative voltage to the first well region of first pass transistor group PTRG1, and does not apply it to a second well region of second pass transistor group PTRG2. That is, the controller uni-directionally drives a word line pass transistor having a relatively low driving capacity by applying the negative voltage only to the first well region. The controller can also bi-directionally drive a selection line pass transistor having a high driving capacity by applying the negative voltage to the first well region and applying a voltage 0V (or a positive voltage; or a negative voltage higher than the negative voltage applied to the first well region) to the second well region.

Figure 3:
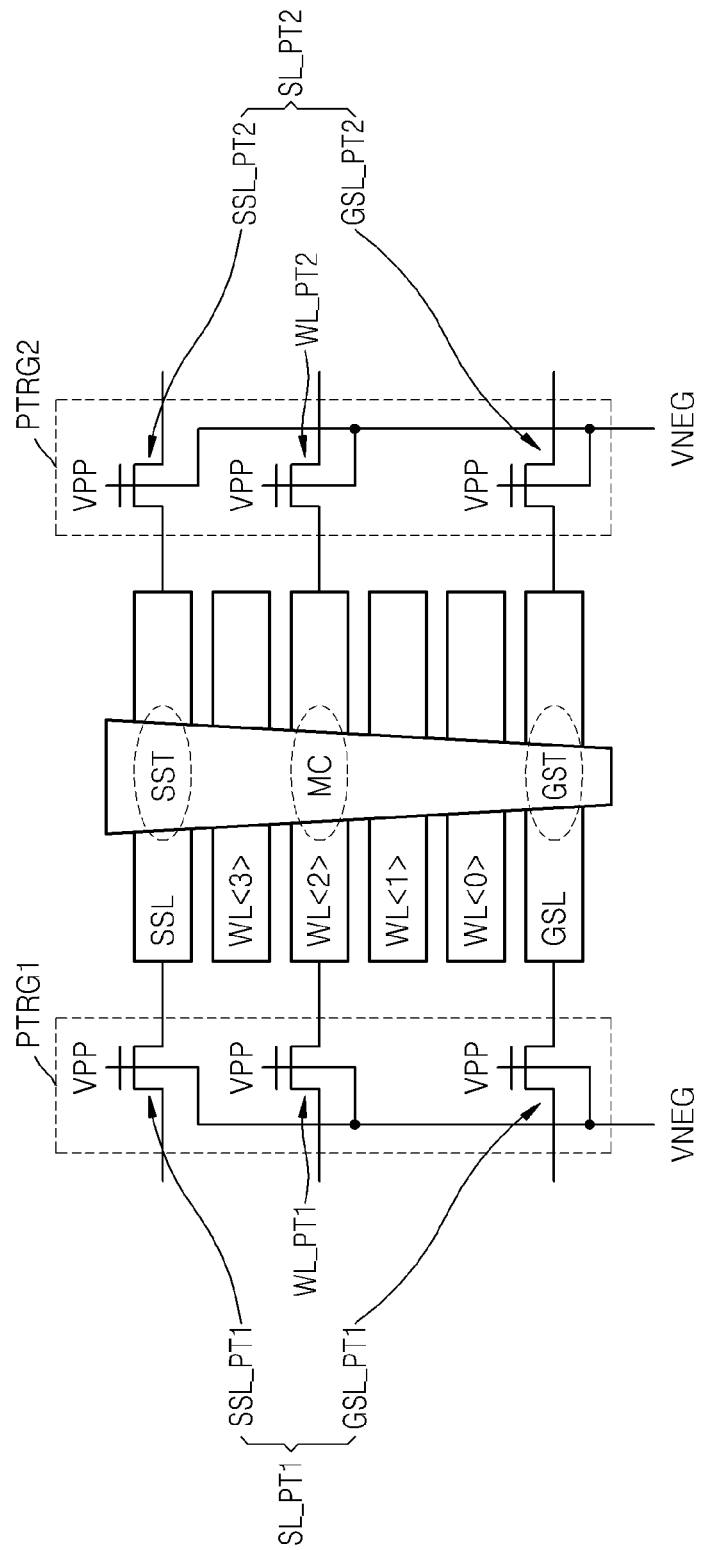
FIG. 3 is a cross-sectional view of a first portion of the 3D semiconductor memory device of FIG. 1 according to another embodiment of the inventive concept.

FIG. 3 is a cross-sectional view of a first portion of the 3D semiconductor memory device of FIG. 1 according to another embodiment of the inventive concept. The embodiment of FIG. 3 is a variation of the embodiment of FIG. 2.

Referring to FIG. 3, the controller applies negative voltages to the first well region of first pass transistor group PTRG1 and the second well region of second pass transistor group PTRG2. In contrast to the embodiment of FIG. 2, the negative voltages applied to the first and second well regions are the same as each other. In other words, unlike the embodiment of FIG. 2, the 3D semiconductor memory device of FIG. 3 does not apply a first negative voltage to a first well region and a second negative voltage higher than the first negative voltage to a second well region. This modification in the embodiment of FIG. 3 can potentially improve negative well bias loading.

Figure 4:
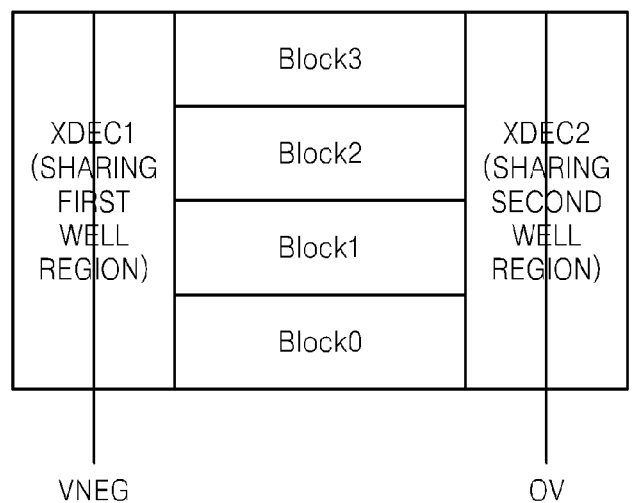
FIGS. 4 and 5 are block diagrams of a 3D semiconductor memory device according to an embodiment of the inventive concept.
Figure 5:
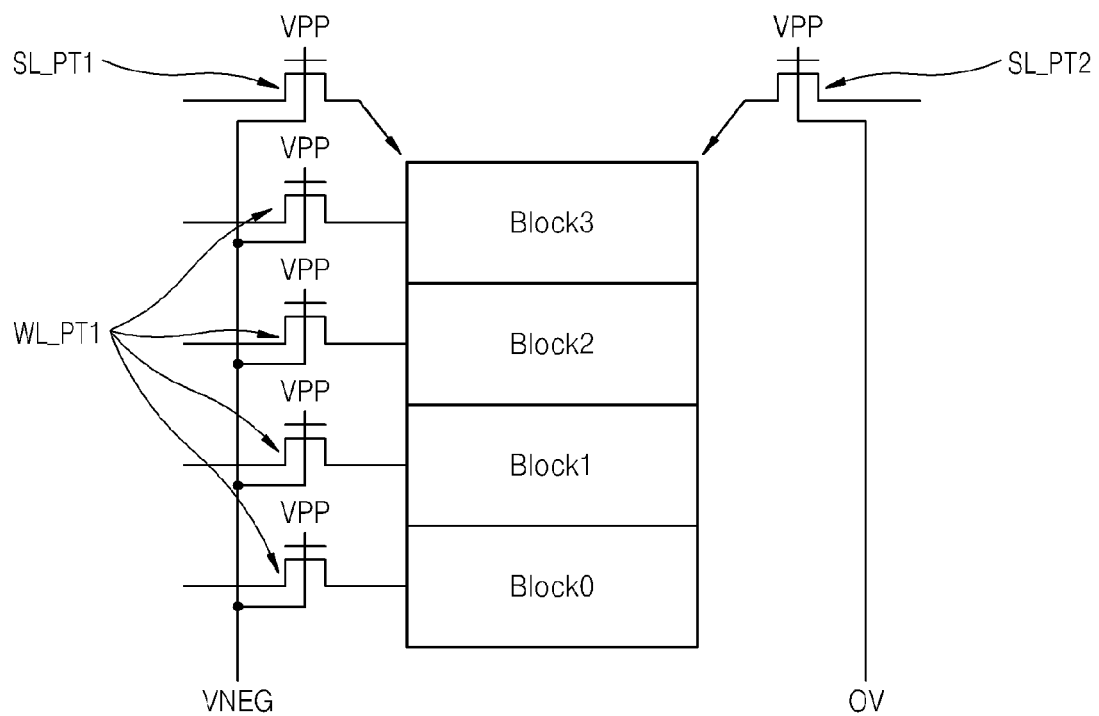

FIGS. 4 and 5 are block diagrams of a 3D semiconductor memory device according to an embodiment of the inventive concept. The 3D semiconductor memory device of FIGS. 4 and 5 is a variation of 3D semiconductor memory device 100 of FIGS. 1 and 2. Accordingly, a description of common features will be omitted in order to avoid redundancy.

Referring to FIGS. 4 and 5, the 3D semiconductor memory device comprises a plurality of blocks, where each block comprises a plurality of memory cell strings as described with reference to FIG. 1.

A controller comprises a first X decoder XDEC1 and a second X decoder XDEC2. First X decoder XDEC1 comprises first pass transistor group PTRG1 and is located in a first direction (e.g., a left side) with respect to the blocks, control selection lines (i.e. source selection lines SSL and ground selection lines GSL), and word lines of the blocks. Second X decoder XDEC2 comprises second pass transistor group PTRG2 and is located in a second direction (e.g., a right side) with respect to the blocks, control source selection lines SSL, and ground selection lines GSL of the blocks, wherein the second direction is opposite the first direction.

As described above, transistors in first pass transistor group PTRG1 of first X decoder XDEC1 share a first well region. Thus, if selected memory cells have a threshold voltage distribution with a negative value, a negative voltage is applied to the first well region connected to all the blocks in order to read the data stored in the selected memory cells. Meanwhile, a voltage 0V (or a positive voltage; or a negative voltage higher than the negative voltage applied to the first well region) is applied to a second well region shared by transistors in second pass transistor group PTRG2 of second X decoder XDEC2. Accordingly, negative well bias loading may be reduced while a selection line pass transistor is bi-directionally driven.

Selectively, a capacity of a first selection line pass transistor SL_PT1 of first pass transistor group PTRG1 may be smaller than that of a second selection line pass transistor SL_PT2 of second pass transistor group PTRG2. This capacity, which affects a bias current, can be expressed as a W/L ratio where W indicates a width of a channel and L indicates a length of a channel. That is, a W/L ratio of first selection line pass transistor SL_PT1 may be smaller than that of second selection line pass transistor SL_PT2. In this case, second selection line pass transistor SL_PT2 receiving 0V drives selection lines with a relatively high capacity, and first selection line pass transistor SL_PT1 drives selection lines with a relatively low capacity. The negative voltage is applied to the first well region of a first selection transistor, which reduces a capacity of the first selection transistor, thereby further reducing the negative well bias loading.

Figure 6:
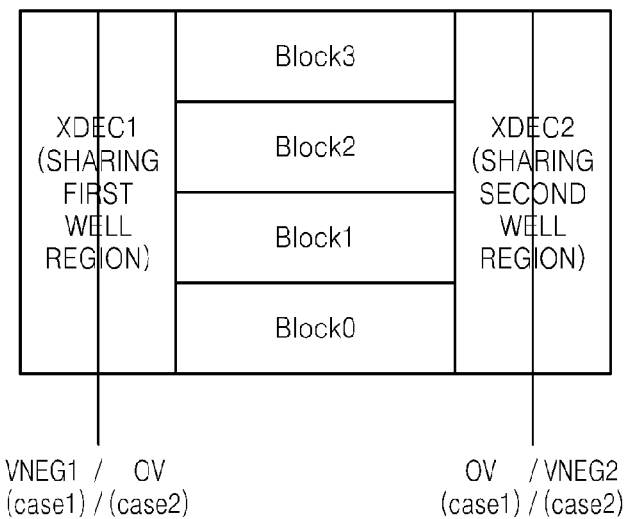
FIGS. 6 and 7 are block diagrams of a 3D semiconductor memory device according to another embodiment of the inventive concept.
Figure 7:
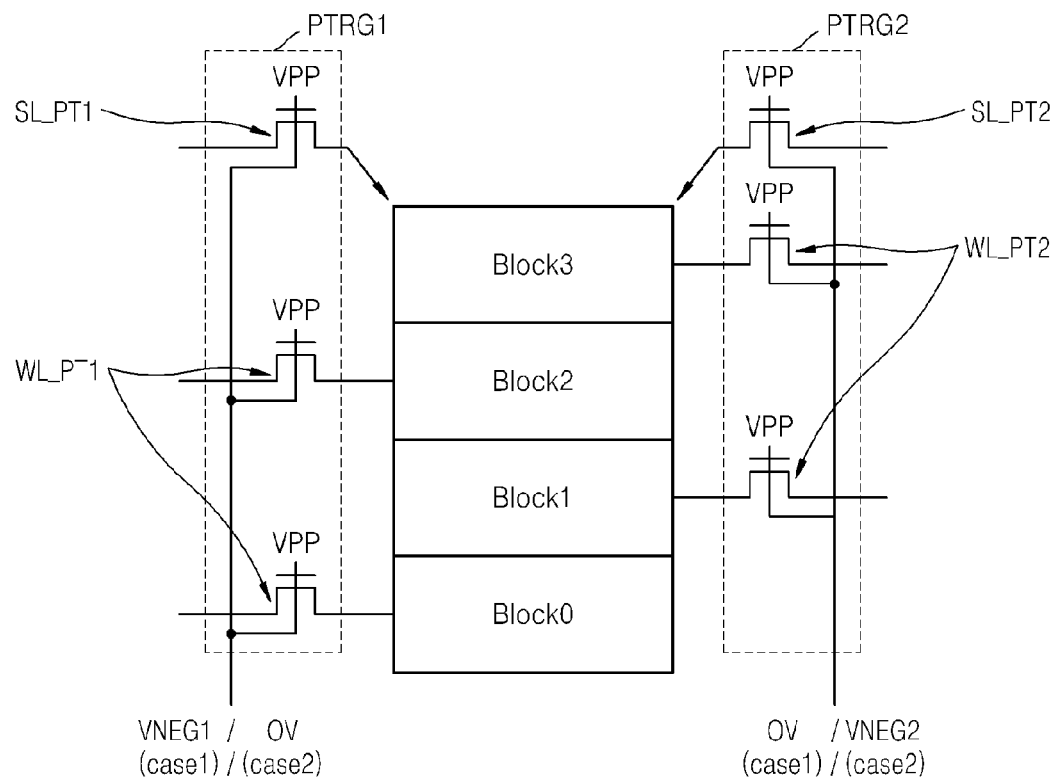

FIGS. 6 and 7 are block diagrams of a 3D semiconductor memory device according to another embodiment of the inventive concept. The 3D semiconductor memory device of FIGS. 6 and 7 is a variation of the 3D semiconductor memory device of FIGS. 4 and 5. Accordingly, a description of common features will be omitted in order to avoid redundancy.

Referring to FIGS. 6 and 7, second pass transistor group PTRG2 further comprises second word line pass transistor WL_PT2 connected to memory cells. Data stored in memory cells of a block is read by first pass transistor group PTRG1 or second pass transistor group PTRG2. That is, data stored in a first memory cell connected to a first block (e.g., block 0 and block 2) is read by first pass transistor group PTRG1, and is not read by second pass transistor group PTRG2. Also, data stored in a second memory cell connected to a second block (e.g., block 2 and block 4) is read by second pass transistor group PTRG2, and is be read by first pass transistor group PTRG1.

For example, in the first block, a selection line (and a selection transistor connected to the selection line) is bi-directionally driven by first selection line pass transistor SL_PT1 and a second selection line transistor, whereas a word line (and a memory cell connected to the word line) is uni-directionally driven by first word line pass transistor WL_PT1. Similarly, in the second block, a selection line (and a selection transistor connected to the selection line) is bi-directionally driven by first selection line pass transistor SL_PT1 and second selection line pass transistor SL_PT2, whereas a word line (and a memory cell connected to the word line) is uni-directionally driven by second word line pass transistor WL_PT2.

More specifically, where block 0 or block 2 is selected and data is read (i.e., in case 1), a first negative voltage is applied to a first well region of first pass transistor group PTRG1, and 0V is applied to a second well region of second pass transistor group PTRG2. Thus, the data stored in the first memory cell connected to the first block is read according to a read voltage supplied by first word line pass transistor WL_PT1.

Where block 1 or block 3 is selected and data is read (i.e., in case 2), 0V is applied to the first well region of first pass transistor group PTRG1, and a second negative voltage is applied to the second well region of second pass transistor group PTRG2. Thus, the data stored in the first memory cell connected to the second block is read according to a read voltage supplied by second word line pass transistor WL_PT2.

Figure 8:
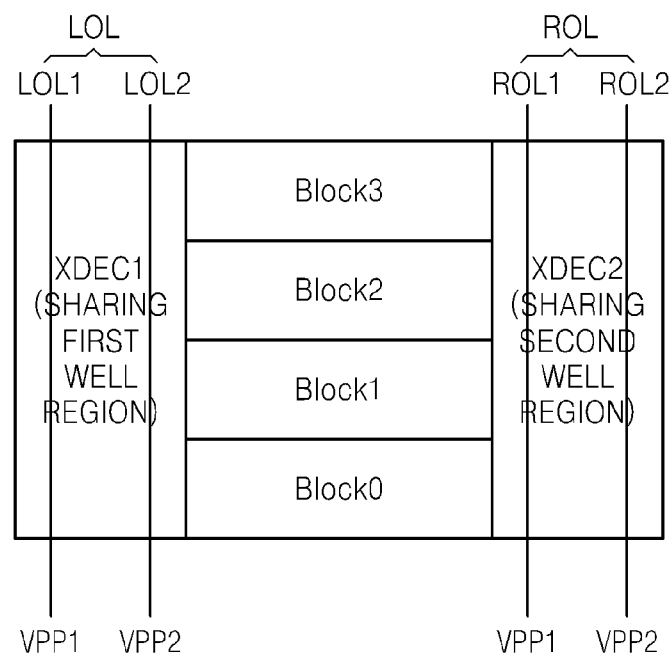
FIGS. 8 and 9 are block diagrams of a 3D semiconductor memory device according to still another embodiment of the inventive concept.
Figure 9:
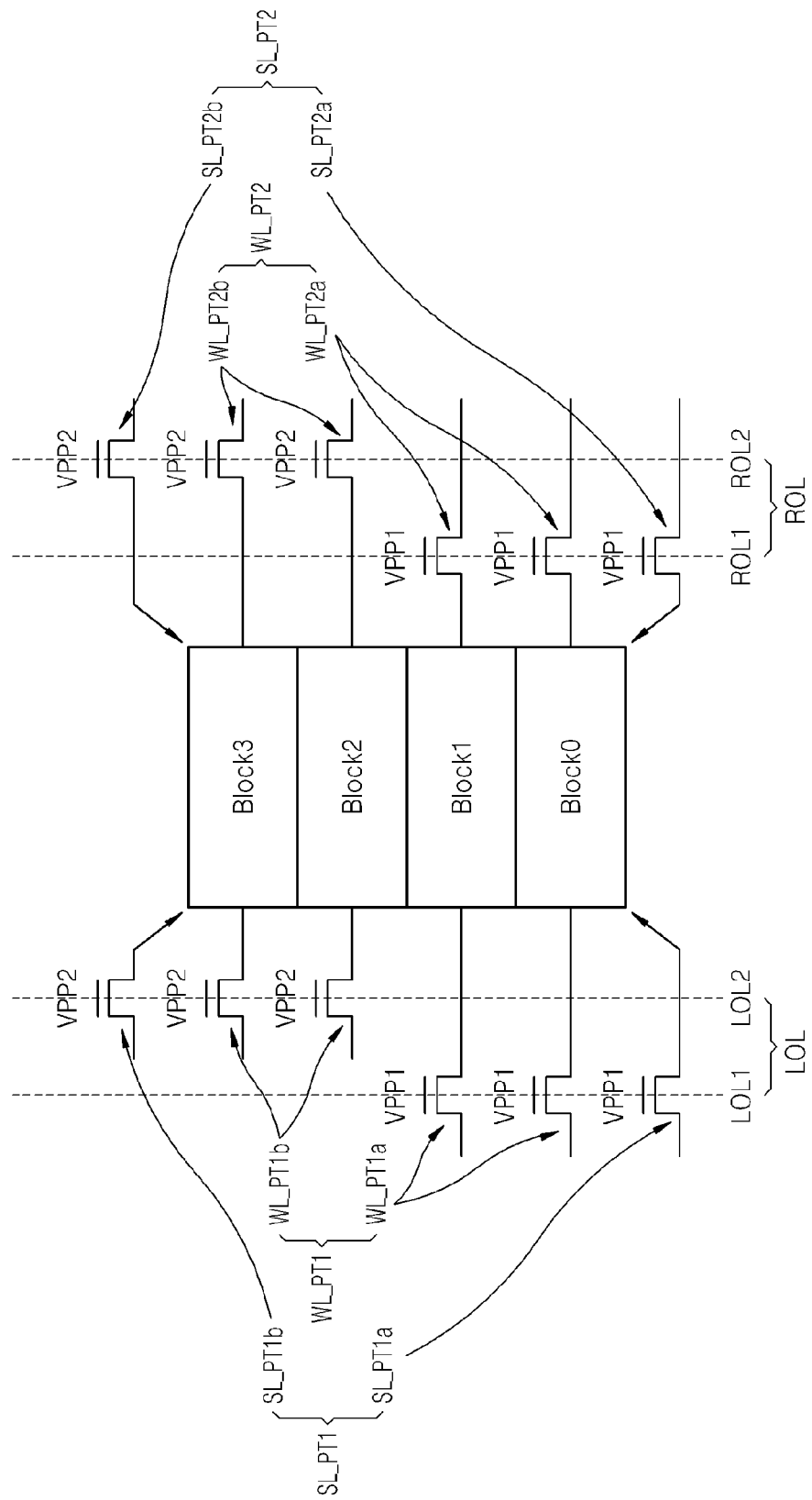

FIGS. 8 and 9 are block diagrams of a 3D semiconductor memory device according to still another embodiment of the inventive concept. The 3D semiconductor memory device of FIGS. 8 and 9 is a variation of the 3D semiconductor memory device shown in FIGS. 4 and 5. Accordingly, a description of common features will be omitted in order to avoid redundancy. In the description that follows, certain features are described as left and right features on account of their respective locations in specific embodiments. These features could alternatively be termed first-direction and second-direction features for greater generality.

Referring to FIGS. 8 and 9, first X decoder XDEC1 of a controller comprises a plurality of left operation lines LOL. Left operation lines LOL are connected to gates of transistors of first pass transistor group PTRG1 in a first direction relative to blocks.

Left operation lines LOL comprise a first left operation line LOL1 and a second left operation line LOL2. First left operation line LOL1 is connected to a gate of a first selection line pass transistor SL_PT1a connected to a selection line (e.g., a source selection line and a ground selection line) of a first block (e.g., blocks 0 and 1), and gates of first word line pass transistors WL_PT1a connected to respective word lines of the blocks 0 and 1. Second left operation line LOL2 is connected to gates of a first selection line pass transistor SL_PT1b connected to a selection line (e.g., a source selection line and a ground selection line) of a second block (e.g., blocks 2 and 3), and gates of first word line pass transistors WL_PT1b connected to respective word lines of the blocks 2 and 3.

Second X decoder XDEC2 of the controller comprises a plurality of right operation lines ROL. Right operation lines ROL are connected to gates of transistors of second pass transistor group PTRG2 in a second direction of blocks. Right operation lines ROL comprise a first right operation line ROL1 and a second right operation line ROL2. First right operation line ROL1 is connected to a gate of a second selection line pass transistor SL_PT2a connected to the selection line of the first block, and gates of second word line pass transistors WL_PT2a connected to the respective word lines of the blocks 0 and 1. Second right operation line ROL2 is connected to gates of a second selection line pass transistor SL_PT2b connected to the selection line of the second block, and gates of second word line pass transistors WL_PT2b connected to the respective word lines of the blocks 2 and 3.

The controller applies operation voltages (i.e., VPP voltages) to first left operation line LOL1 and first right operation line ROL1 where the first block is selected, and it applies operation voltages (i.e., VPP voltages) to the second left operation line LOL2 and second right operation line ROL2 where the second block is selected. The operation of the controller is illustrated by the following Table 1.

TABLE 1

| Selected Blocks | First Left Operation Line (V) | Second Left Operation Line (V) | First Right Operation Line (V) | Second Right Operation Line (V) |
|---|---|---|---|---|
| Block 0, Block 1 | ON, VPP1 = VPP | OFF, VPP2 = 0 | ON, VPP1 = VPP | OFF, VPP2 = 0 |
| Block 2, Block 3 | OFF, VPP1 = 0 | ON, VPP2 = VPP | OFF, VPP1 = 0 | ON, VPP2 = VPP |

The operation voltages (i.e., VPP voltages) are used to drive pass transistors (i.e. the (source/ground) selection line pass transistors SL_PT1 and SL_PT2 and the word line pass transistors WL_PT1 and WL_PT2). For bi-directional driving of the pass transistors, a stable operation voltage is typically applied. Accordingly, a VPP loading problem occurs, which may require an increase in the size of an operation voltage pump (i.e., a VPP pump). However, in the embodiment of FIGS. 8 and 9, the controller applies the VPP voltages only to operation lines allocated to a selected block, which may ameliorate the VPP loading problem.

Figure 10:
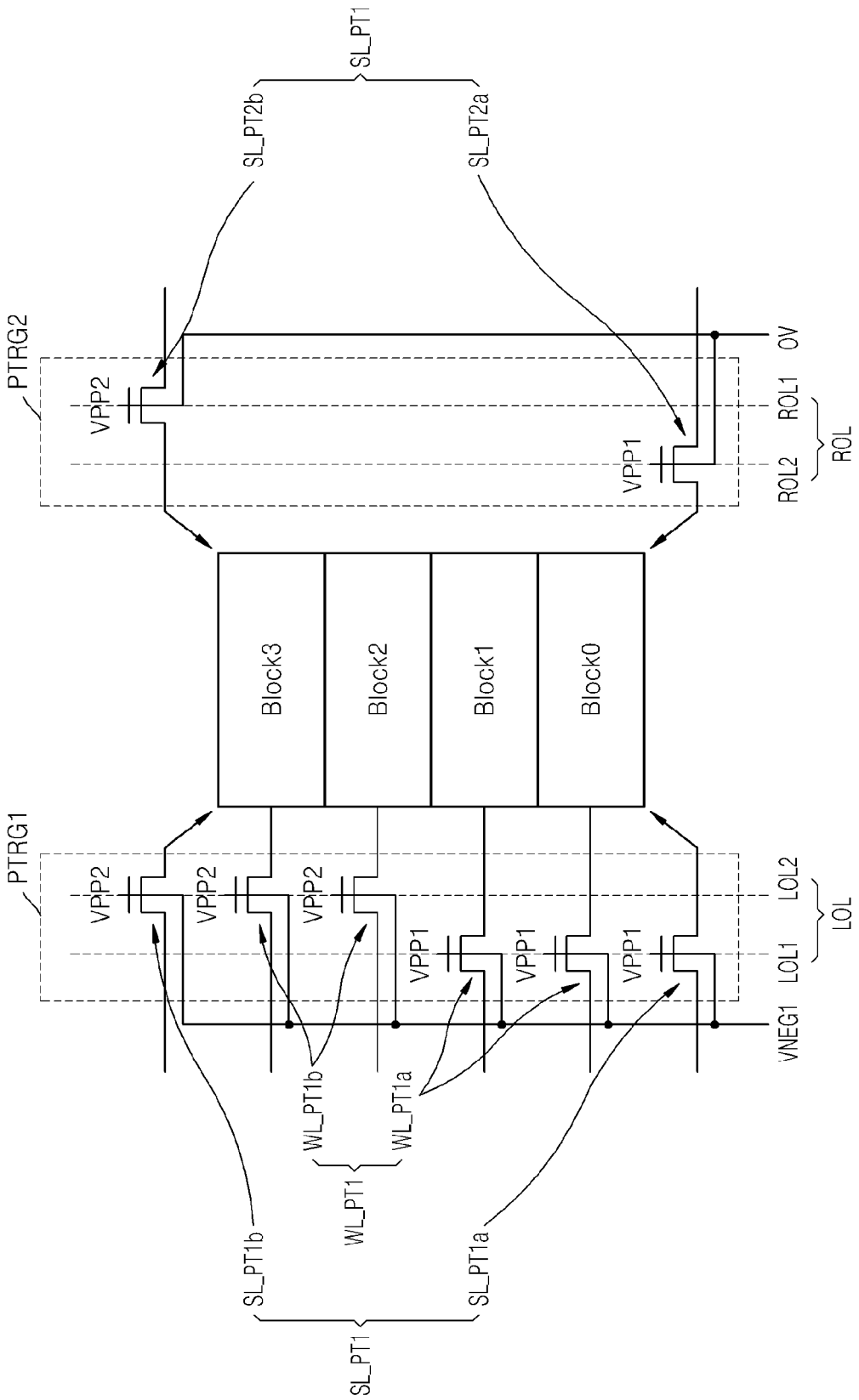
FIGS. 10 and 11 are block diagrams of a 3D semiconductor memory device according to still another embodiment of the inventive concept.
Figure 11:
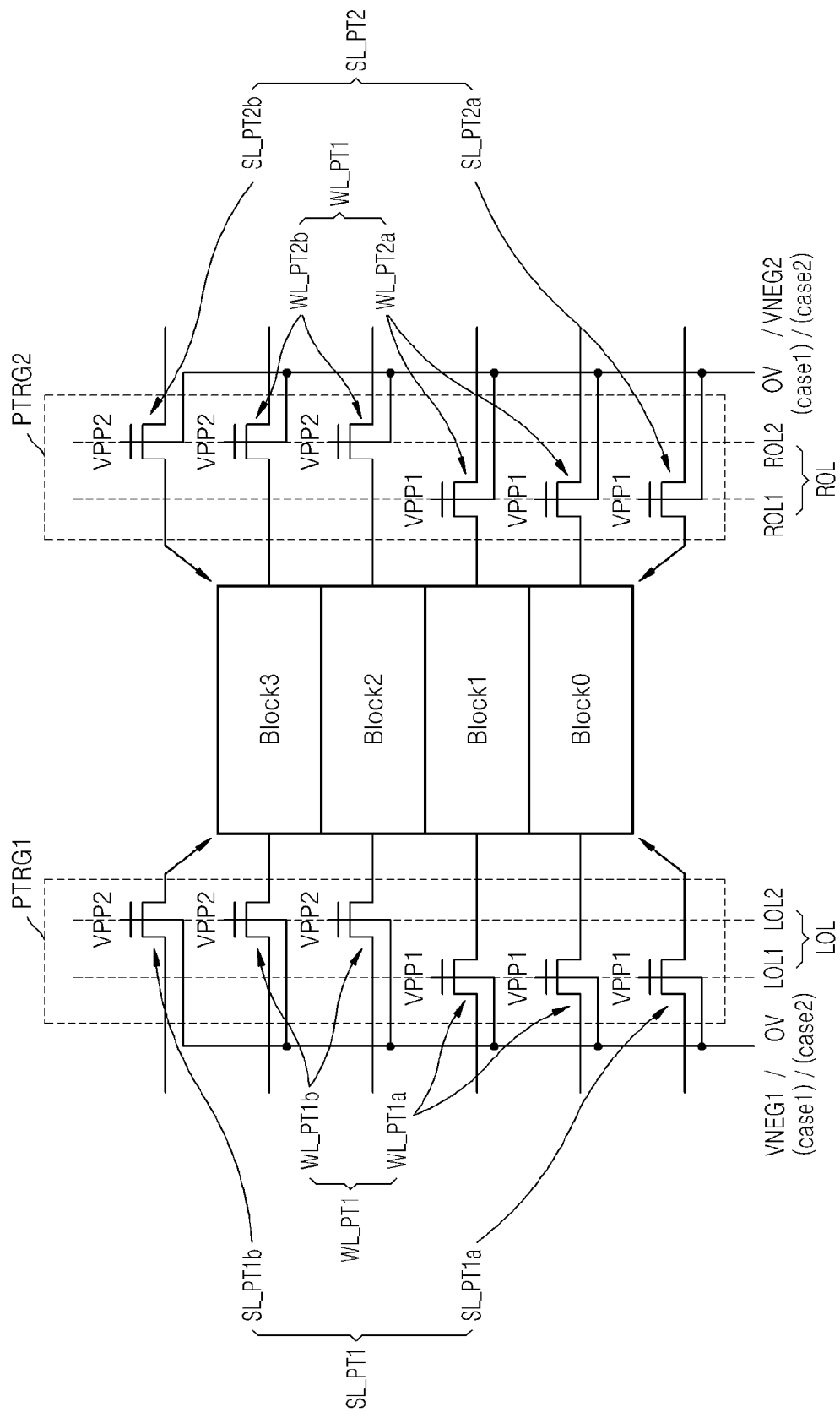

FIGS. 10 and 11 are block diagrams of a 3D semiconductor memory device according to still another embodiment of the inventive concept.

Referring to FIG. 10, a well bias with a negative voltage is applied to first pass transistor group PTRG1 that shares the first well region, and a well bias of 0V is applied to second pass transistor group PTRG2 during a read operation as shown in FIGS. 4 and 5. Left operation lines LOL and right operation lines ROL are also provided as shown in FIGS. 9 and 10, and thus operation voltages are selectively applied to gates of transistors of first pass transistor group PTRG1 and second pass transistor group PTRG2 according to selected blocks.

Referring to FIG. 11, a well bias with a first negative voltage is applied to first pass transistor group PTRG1 that shares the first well region, and a well bias of a second negative voltage is applied to second pass transistor group PTRG2 during a read operation as shown in FIGS. 6 and 7. Left operation lines LOL and right operation lines LOL are also provided as shown in FIGS. 9 and 10, and operation voltages are selectively applied to gates of transistors of first pass transistor group PTRG1 and second pass transistor group PTRG2 according to selected blocks.

Figure 12:
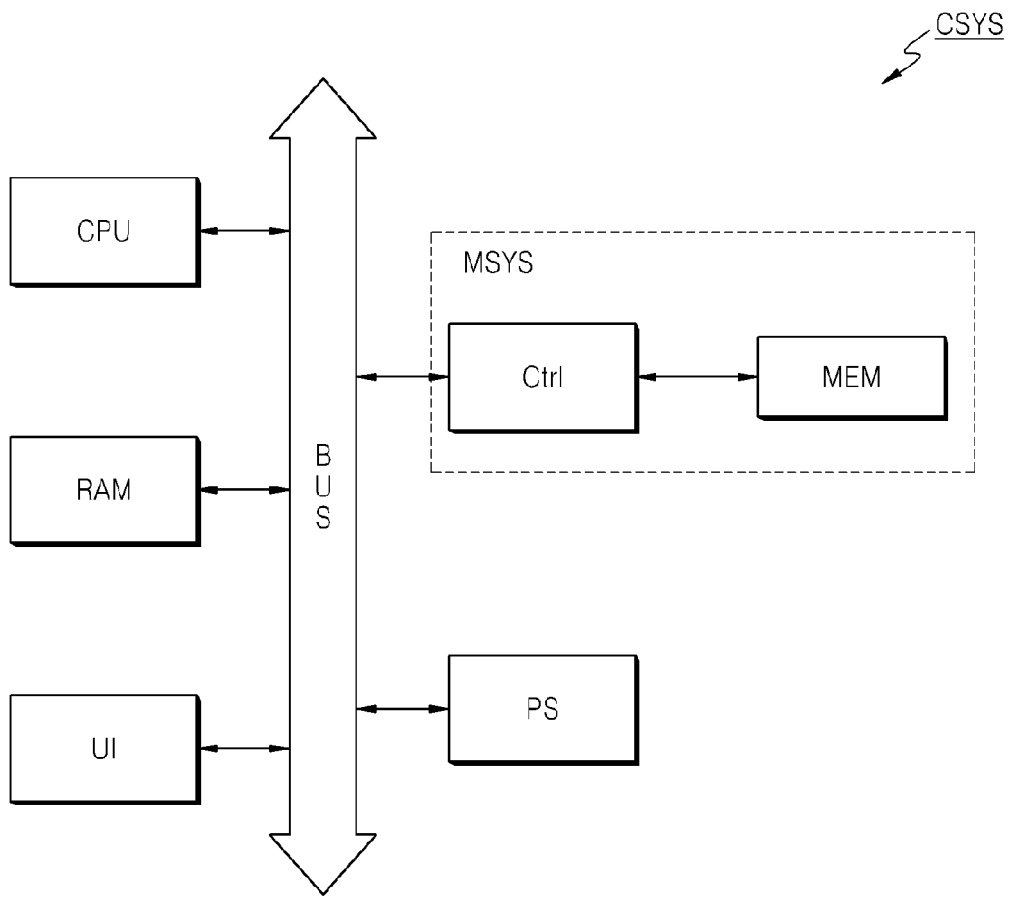
FIG. 12 is a block diagram of a computing system according to an embodiment of the inventive concept.

FIG. 12 is a block diagram of a computing system CSYS according to an embodiment of the inventive concept.

Referring to FIG. 12, computing system CSYS comprises a processor CPU, a user interface UI, and a semiconductor memory system MSYS, which are electrically connected to a bus BUS. Semiconductor memory system MSYS comprises a memory controller Ctrl and a memory device MEM. N-bit data (N>1) that is processed or will be processed by processor CPU is stored in memory device MEM via memory controller Ctrl. Memory device MEM of semiconductor memory system MSYS comprises the 3D semiconductor memory device shown in FIG. 1. Thus, the operation speed of computing system CSYS of FIG. 14 may be increased by memory device MEM.

Computing system CSYS further comprises a power supply apparatus PS. Also, if memory device MEM is a flash memory device incorporating the 3D semiconductor memory device as shown in FIG. 1, computing system CSYS can further comprise a volatile memory device, such as a random access memory (RAM). Where computing system CSYS is a mobile apparatus, a battery for supplying a driving voltage of computing system CSYS and a modem such as a baseband chipset may be additionally provided. In addition, a variety of other features can also be included in computing system CSYS, such as an application chipset, a camera image processor CIS, and a mobile dynamic random access memory (DRAM), no name but a few.

Figure 13:
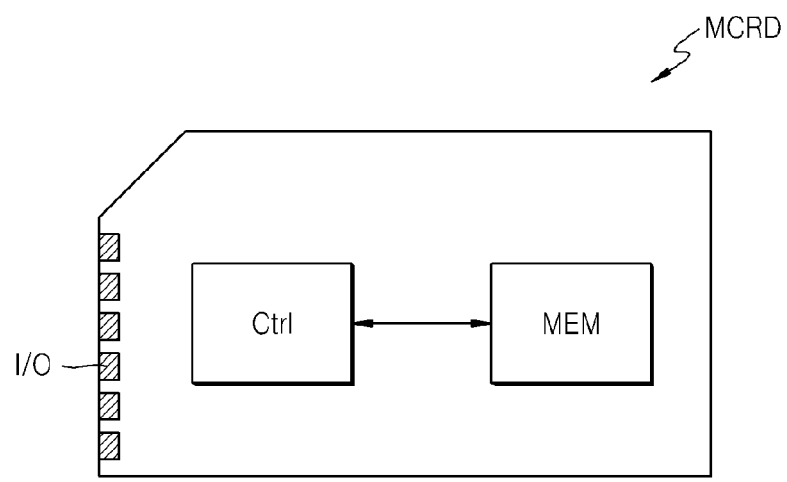
FIG. 13 is a block diagram of a memory card according to an embodiment of the inventive concept.

FIG. 13 is a block diagram of a memory card MCRD according to an embodiment of the inventive concept.

Referring to FIG. 13, memory card MCRD comprises a memory controller Ctrl and a memory device MEM. Memory controller Ctrl controls data to be written on or read from semiconductor memory device MEM in response to a request of an external host (not shown), received through an input and output unit I/O. Also, where memory device MEM of FIG. 13 is a flash memory device, memory controller Ctrl controls an erase operation on memory device MEM. To perform such control operations, memory controller Ctrl of memory card MCRD comprises RAM and interface units (not shown), which interface with hosts and semiconductor memory device MEM. Memory card MCRD may incorporate the 3D semiconductor memory device shown in FIG. 1.

Memory card MCRD of FIG. 13 may comprise, for instance, a compact flash card (CFC), a microdrive, a smart media card (SMC), a multimedia card (MMC), a security digital card (SDC), a memory stick, or a universal serial bus (USB) flash memory driver.

Figure 14:
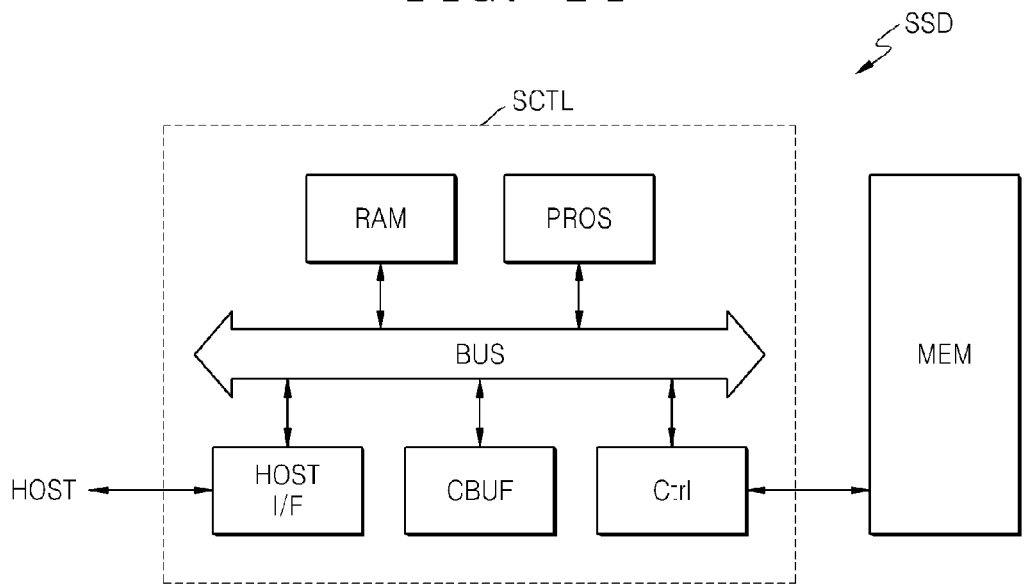
FIG. 14 is a block diagram of a solid state drive (SSD) according to an embodiment of the inventive concept.

FIG. 14 is a block diagram of an SSD according to an embodiment of the inventive concept.

Referring to FIG. 14, the SSD comprises a SSD controller SCTL and a memory device MEM. SSD controller SCTL comprises a processor PROS, RAM, a cache buffer CBUF, and a memory controller Ctrl, which are connect to a bus BUS. Processor PROS controls memory controller Ctrl to transmit and receive data to and from memory device MEM in response to a request (command, address or data) of a host (not shown). Processor PROS and memory controller Ctrl of the SSD can be implemented, for instance, in one ARM processor. Data for operating processor PROS may be loaded in the RAM.

A host interface HOST I/F transmits a received request of the host to processor PROS, or transmits received data from memory device MEM to the host. Host interface HOST I/F may interface with the host using one of various standardized interface protocols, such as USB, man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE). The data received from or to be transmitted to memory device MEM may be temporarily stored in cache buffer CBUF. Cache buffer CBUF may be an SRAM. Memory device MEM installed in the SSD may be the 3D semiconductor memory device shown in FIG. 1.

Figure 15:
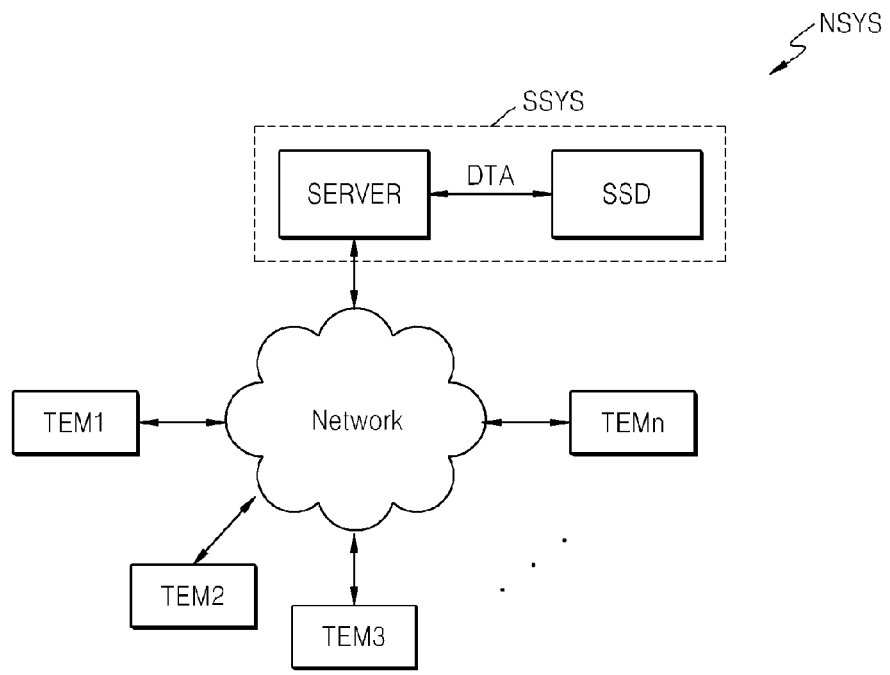
FIG. 15 is a block diagram of a server system and a network system comprising a solid state drive (SSD) according to an embodiment of the inventive concept.

FIG. 15 is a block diagram of a server system SSYS and a network system NSYS incorporating an SSD.

Referring to FIG. 15, network system NSYS comprises server system SSYS and a plurality of terminals TEM1 to TEMn, which are electrically connected through a network. Server system SSYS comprises a server SERVER and the SSD, wherein server SERVER processes requests received from the plurality of terminals TEM1 to TEMn and the SSD stores data that corresponds to the requests received from the plurality of terminals TEM1 to TEMn. In this regard, the SSD of FIG. 15 may be the SSD of FIG. 15.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A three-dimensional (3D) semiconductor memory device, comprising:
   at least one memory cell string comprising a selection transistor and a memory cell;
   a first pass transistor group sharing a first well region and comprising a first selection line pass transistor connected to the selection transistor and a first word line pass transistor connected to the memory cell;
   a second pass transistor group sharing a second well region and comprising a second selection line pass transistor connected to the selection transistor; and
   a controller that controls the first pass transistor group and the second pass transistor group,
   wherein the controller applies a first negative voltage to the first well region and applies a second voltage higher than the first negative voltage to the second well region during a read operation, and
   wherein the selection transistor is turned on or off according to driving voltages supplied concurrently through the first selection line pass transistor and the second selection line pass transistor.

2. The 3D semiconductor memory device of claim 1, wherein the memory cell has a threshold voltage distribution with a negative value.

3. The 3D semiconductor memory device of claim 1, wherein the second voltage is 0V.

4. The 3D semiconductor memory device of claim 1, wherein data stored in the memory cell is accessible in a read operation to the first pass transistor group and not the second pass transistor group.

5. The 3D semiconductor memory device of claim 4, wherein a word line connected to the memory cell is unidirectionally driven by the first pass transistor group in the read operation.

6. The 3D semiconductor memory device of claim 1, wherein the data stored in the memory cell is read according to a read voltage supplied by the first word line pass transistor.

7. The 3D semiconductor memory device of claim 1, wherein the memory cell string is disposed between the first pass transistor group and the second pass transistor group.

8. The 3D semiconductor memory device of claim 1, wherein the first pass transistor group is located on a first side of the memory cell string, and the second pass transistor group is located on a second side of the memory cell string opposite the first side.

9. A three-dimensional (3D) semiconductor memory device comprising:

at least one block comprising a plurality of memory cell strings each comprising at least one selection transistor and at least one memory cell;

a first pass transistor group sharing a first well region and comprising a first selection line pass transistor connected to the at least one selection transistor and a first word line pass transistor connected to the at least one memory cell;

a second pass transistor group sharing a second well region and comprising a second selection line pass transistor connected to the at least one selection transistor; and a controller that controls the first pass transistor group and the second pass transistor group, wherein the controller applies a first negative voltage to the first well region and applies 0V to the second well region during a read operation, and wherein the at least one selection transistor is turned on or off according to driving voltages supplied concurrently through the first selection line pass transistor and the second selection line pass transistor.

10. The 3D semiconductor memory device of claim 9, wherein the at least one selection transistor is bi-directionally driven by the first selection line pass transistor and the second selection line pass transistor, and the at least one memory cell is uni-directionally driven by the first word line pass transistor.

11. The 3D semiconductor memory device of claim 9, wherein the at least one block comprises a first block and a second block,
wherein the second pass transistor group further comprises a second word line pass transistor connected to the at least one memory cell,
wherein the first word line pass transistor of the first pass transistor group is connected to a first memory cell of the first block, and
wherein the second word line pass transistor of the second pass transistor group is connected to a second memory cell of the second block.

12. The 3D semiconductor memory device of claim 11, wherein data stored in the first memory cell is read according to a read voltage supplied by the first word line pass transistor,
wherein data stored in the second memory cell is read according to a read voltage supplied by the second word line pass transistor.

13. The 3D semiconductor memory device of claim 11, wherein the data stored in the first memory cell is read by the first pass transistor group and is not read by the second pass transistor group,
wherein the data stored in the second memory cell is read by the second pass transistor group and is not read by the first pass transistor group.

14. The 3D semiconductor memory device of claim 9, further comprising:
a plurality of first-direction operation lines connected to gates of transistors of the first pass transistor group in a first direction of the at least one block; and
a plurality of second-direction operation lines connected to gates of transistors of the second pass transistor group in a second direction opposite to the first direction of the at least one block.

15. The 3D semiconductor memory device of claim 14, wherein the at least one block comprises a first block and a second block,
wherein the plurality of first-direction operation lines comprises:
a first first-direction operation line connected to the gates of the transistors of the first pass transistor group connected to a selection line and a word line of the first block; and
a second first-direction operation line connected to the gates of the transistors of the first pass transistor group connected to a selection line and a word line of the second block,
wherein the plurality of second-direction operation lines comprises:
a first second-direction operation line connected to the gates of the transistors of the second pass transistor group connected to the selection line and the word line of the first block; and
a second second-direction operation line connected to the gates of the transistors of the second pass transistor group connected to the selection line and the word line of the second block.

16. The 3D semiconductor memory device of claim 15, wherein the controller applies operation voltages to the first first-direction operation line and the first second-direction operation line when the first block is selected and applies operation voltages to the second first-direction operation line and the second second-direction operation line when the second block is selected.

17. A three-dimensional (3D) semiconductor memory device, comprising:
a 3D array of memory cell strings each comprising at least one selection transistor and at least one memory cell; and
first and second pass transistor groups located on opposite sides of the 3D array of memory cell strings and configured to bi-directionally drive at least one of the selection transistors and to uni-directionally drive at least one of the memory cells during a read operation,
wherein the at least one of the selection transistors is turned on or off according to driving voltages supplied concurrently through the first and second pass transistor groups.

18. The 3D semiconductor memory device of claim 17, further comprising a controller configured to apply a first negative voltage to a first well region associated with the first pass transistor group, and further configured to apply a second voltage higher than the first negative voltage to a second well region associated with the second pass transistor group during a read operation.

19. The 3D semiconductor memory device of claim 18, wherein the second voltage is 0V.

* * * * *